United States Patent
Kon et al.

(10) Patent No.: US 7,830,013 B2
(45) Date of Patent: Nov. 9, 2010

(54) MATERIAL FOR FORMING ADHESION REINFORCING LAYER, ADHESION REINFORCING LAYER, SEMICONDUCTOR DEVICE, AND MANUFACTURING METHOD THEREOF

(75) Inventors: Junichi Kon, Kawasaki (JP); Ei Yano, Kawasaki (JP); Yoshihiro Nakata, Kawasaki (JP); Tadahiro Imada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 677 days.

(21) Appl. No.: 11/395,263

(22) Filed: Apr. 3, 2006

(65) Prior Publication Data

US 2007/0111539 A1 May 17, 2007

(30) Foreign Application Priority Data

Nov. 14, 2005 (JP) ............................. 2005-329088

(51) Int. Cl.
*H01L 23/12* (2006.01)
*H01L 23/48* (2006.01)
*H01L 21/4763* (2006.01)
*H01L 51/40* (2006.01)

(52) U.S. Cl. ............... 257/759; 257/642; 257/E51.027; 257/E51.046; 257/E21.584; 438/623; 438/780

(58) Field of Classification Search .................... 438/99, 438/584, 778, 780, 781, 622, FOR. 135, 623, 438/FOR. 395; 257/40, 632, 635, 642, E51.001, 257/E51.024, E51.046, E51.027, E21.028, 257/E21.584, 759; 522/172, 173, 178, 181, 522/904

See application file for complete search history.

(56) References Cited

U.S. PATENT DOCUMENTS 4,954,565 A * 9/1990 Liles .......................... 524/860

(Continued)

FOREIGN PATENT DOCUMENTS

EP 1 296 365 A2 3/2003

(Continued)

OTHER PUBLICATIONS

Korean Office Action dated Apr. 26, 2007, issued in corresponding to Korean Application No. 9-5-2007-022367115.

(Continued)

*Primary Examiner*—Matthew Smith
*Assistant Examiner*—Quovaunda Jefferson
(74) *Attorney, Agent, or Firm*—Fujitsu Patent Center (57) ABSTRACT

The present invention aims at providing: a material for forming an adhesion reinforcing layer which can reinforce the adhesion between a low dielectric constant film, especially a low dielectric constant film containing an inorganic material, and other members; an adhesion reinforcing layer formed by the said material and exhibits superior adhesion; a fast and highly reliable semiconductor device having the adhesion reinforcing layer; and a manufacturing method thereof. The material for forming an adhesion reinforcing layer contains at least any one of organoalkoxysilane having a basic functional group, a basic additive and organoalkoxysilane. The adhesion reinforcing layer is formed by the said material. The manufacturing method of a semiconductor device includes a process for forming a low dielectric constant film and, at least before or after the process for forming a low dielectric constant film, a process for forming an adhesion reinforcing layer with the said material.

13 Claims, 1 Drawing Sheet

U.S. PATENT DOCUMENTS

| | | | |
|---|---|---|---|
| 5,246,995 A * | 9/1993 | Murakami et al. | 524/265 |
| 5,516,858 A * | 5/1996 | Morita et al. | 525/478 |
| 6,107,505 A * | 8/2000 | Yoshida et al. | 556/450 |
| 6,455,443 B1 | 9/2002 | Eckert et al. | |
| 6,613,834 B2 | 9/2003 | Nakata et al. | |
| 6,787,191 B2 | 9/2004 | Hanahata et al. | |
| 2003/0059550 A1 | 3/2003 | Nishikawa et al. | |
| 2003/0091838 A1 | 5/2003 | Hayashi et al. | |
| 2003/0099844 A1 | 5/2003 | Hanahata et al. | |
| 2005/0173803 A1 | 8/2005 | Lu et al. | |
| 2006/0009575 A1 | 1/2006 | Nakashima | |
| 2006/0084277 A1 | 4/2006 | Nakashima et al. | |
| 2009/0075096 A1 * | 3/2009 | Butikofer et al. | 428/447 |

FOREIGN PATENT DOCUMENTS

| | | | |
|---|---|---|---|
| EP | 1 535 976 A1 | | 6/2005 |
| EP | 1 564 798 A1 | | 8/2005 |
| JP | 03-008709 | * | 1/1991 |
| JP | 03-008709 A | | 1/1991 |
| JP | 10-41222 A | | 2/1998 |
| JP | 2001-345317 A | | 12/2001 |
| JP | 2002-38081 A | | 2/2002 |
| JP | 2002-40673 A | | 2/2002 |
| JP | 2002-513512 A | | 5/2002 |
| JP | 2003-179050 A | | 6/2003 |
| JP | 2004-149714 A | | 5/2004 |
| JP | 2004-153147 A | | 5/2004 |
| JP | 2004-277463 A | | 10/2004 |
| JP | 2004-532514 A | | 10/2004 |
| WO | WO-98/44544 | | 10/1998 |

OTHER PUBLICATIONS

Extended European Search Report dated Jul. 28, 2006, issued in corresponding European Application No. 06007728.6.

Philippe De Rouffignac et al.; "Sealing Porous Low-k dielectrics with Silica" Electrochemical and Solid-State Letters, vol. 7 No. 12pp. G306-G308.

Japanese Office Action for Japanese Patent Application 2005-329088 mailed on Jul. 20, 2010. A partial English-language translation is provided.

* cited by examiner

FIG. 1

MATERIAL FOR FORMING ADHESION REINFORCING LAYER, ADHESION REINFORCING LAYER, SEMICONDUCTOR DEVICE, AND MANUFACTURING METHOD THEREOF

CROSS-REFERENCE TO RELATED APPLICATIONS

This application is based upon and claims the benefits of the priority from the prior Japanese Patent Application No. 2005-329088, filed on Nov. 14, 2005, the entire contents of which are incorporated herein by reference.

BACKGROUND OF THE INVENTION

1. Field of the Invention

The present invention relates to: a material for forming an adhesion reinforcing layer which can reinforce the adhesion between a low dielectric constant film and other members, in particular between a low dielectric constant film containing an inorganic material and other members; an adhesion reinforcing layer which is formed by the material for forming an adhesion reinforcing layer and exhibits superior adhesion; a semiconductor device having the adhesion reinforcing layer, which is fast and highly reliable; and a manufacturing method thereof.

2. Description of the Related Art

The acting speed of a semiconductor device has long been increased according to the scaling law by miniaturizing the semiconductor device. The recent high-density semiconductor integrated circuit device has a multi-layer wiring structure in wiring between individual semiconductor devices. In the multi-layer wiring structure, however, adjacent wiring patterns in the multi-layer wiring structure are in contiguity with each other, and a problem of wiring delay occurs due to a parasitic capacitance between the wiring patterns since the semiconductor devices are extremely miniaturized. The parasitic capacitance is inversely proportional to the distance between the wiring patterns and directly proportional to the dielectric constant of an insulator located between the wiring patterns.

Given this factor, the use of a material with low dielectric constant for the inter-layer dielectric constant film (the insulating film) in the multi-layer wiring structure for the reduction of the parasitic capacitance has been examined in order to improve the issue of the wiring delay.

Regarding the dielectric constant of the inter-layer insulating film, the dielectric constant of a conventionally-used $CVD-SiO_2$ film is about four, and the dielectric constant of an SiOF film, which is formed by the addition of fluorine to the $CVD-SiO_2$ film for further reduction of the dielectric constant, is about 3.3 to 3.5 at best. In addition to these, a polyallylether material has been considered as an organic insulating material, but the dielectric constant is about 2.6 to 2.9 at best. Therefore, none of the above-mentioned materials provides sufficient effect of reducing the parasitic capacitance in the recent high-density semiconductor integrated circuit, and there has been a problem that a required acting speed cannot be met.

In this regard, the use of a porous insulating film as a so-called low dielectric constant inter-layer insulating film with a lower dielectric constant has been focused. The porous insulating film is formed by: adding an organic resin which evaporates or decomposes upon heating to a coating material; then, applying the coating material by spin coating method; and finally heating to evaporate or decompose the organic resin so that the porosity is provided to the insulating film. In this case, the dielectric constant is reduced to 2.5 or below; therefore, the possibility of applying the porous insulating film to a semiconductor device as a low dielectric constant inter-layer insulating film has been examined.

Incidentally, since the wiring delay is proportional to the product of the parasitic capacitance between wiring and the wiring resistance, the reduction of resistance in the wiring itself by employing Cu with low resistance in place of conventionally-used Al as a wiring material. In this case, it is necessary to prevent the dispersion of the cupper atoms within the wiring into the inter-layer insulating film, and the arrangement of a copper barrier film containing mainly silicon carbide (SiC) and silicon oxycarbide (SiOC) has been attempted.

However, the formation of the porous insulating film on the copper barrier film reduces the contact area with the copper barrier film compared to the conventional insulating layer since the porous insulating film consists of many pores; therefore, there is an issue of decrease in adhesion. The decrease in adhesion causes an interfacial debonding between the low dielectric constant insulating film and the copper barrier film when a multi-layer wiring is formed, and the problem of the interfacial debonding becomes prominent as the number of the wiring layer increases. In addition, the problem of interfacial debonding occurs due to the reduction in adhesion in laminating not only the copper barrier film but also other films.

As a method for improving the adhesion between the insulating film and the copper barrier film, for example, a surface treatment of the copper barrier film with a silane coupling agent is known (Japanese Patent Application Laid-Open (JP-A) Nos. 2001-345317, 2002-40673, 2002-38081 and 2004-532514). Although they are quite effective in improving the adhesion between an inorganic material and an organic material such as combination of the copper barrier film and an organic insulating film, they are almost ineffective in improving the adhesion between inorganic materials such as combination of the copper barrier film and the porous insulating film. In addition, alkoxysilane contained in the silane coupling agent is highly reactive with water, causing a hydrolysis reaction. Therefore, the solution has extremely low preservation stability, and the application to manufacturing semiconductor devices has been difficult.

Hence, the material for forming an adhesion reinforcing film which can provide superior adhesion between films made of inorganic materials as well as reinforce the adhesion between the low dielectric constant film and other members, and related technologies employing thereof has not currently been produced yet.

The present invention is aimed at resolving the above issue and achieving the following object. That is, the object of the present invention is to provide: a material for forming an adhesion reinforcing layer which can reinforce the adhesion between a low dielectric constant film and other members, in particular between a low dielectric constant film containing an inorganic material and other members; an adhesion reinforcing layer which is formed by the material for forming an adhesion reinforcing layer and exhibits superior adhesion; a semiconductor device having the adhesion reinforcing layer, which is fast and highly reliable; and a manufacturing method thereof.

Regarding the above-mentioned issues, keen examinations by the inventors resulted in the following insights. That is, it was observed that the use of a material for forming an adhesion reinforcing layer including at least any one of organoalkoxysilane having a basic functional group, a basic additive and organoalkoxysilane produces superior adhesion between inorganic materials and that an adhesion reinforcing layer which can reinforce the adhesion between the low dielectric constant film containing an inorganic material and other members may be achieved. Also, the inventors discovered that the material for forming an adhesion reinforcing layer had favorable preservation stability for its basicity. These insights lead to achieving the present invention.

SUMMARY OF THE INVENTION

The present invention is based on the insight of the inventors, and the means for solving the above-mentioned issues are listed in 'What is claimed is:' hereinafter. That is:

A material for forming an adhesion reinforcing layer of the present invention is characterized by containing at least any one of organoalkoxysilane having a basic functional group, a basic additive and organoalkoxysilane. Since the material for forming an adhesion reinforcing layer includes at least organoalkoxysilane and shows basicity, superior adhesion is provided between inorganic materials, and the adhesion between a low dielectric constant film containing an inorganic material and other members is reinforced. Therefore, for example, a porous low dielectric constant film and a copper barrier film are easily adhered. The material can be favorably used for the formation of a multi-layer wiring and various semiconductor devices as well.

The adhesion reinforcing layer of the present invention is characterized by the use of the material for forming an adhesion reinforcing layer of the present invention. The adhesion reinforcing layer, which is formed by the material for forming an adhesion reinforcing layer, exhibits superior adhesion and is possible to bond strongly inorganic materials. Therefore, the adhesion reinforcing layer is, for example, arranged between a porous low dielectric constant film and a copper barrier film and favorably used for the formation of multi-layer wiring. Furthermore, the adhesion reinforcing layer prevents the low dielectric constant film from debonding and enables the increase in the signal transmission speed; therefore, it is particularly favorably used for a semiconductor integrated circuit which requires the increase in the response speed.

The manufacturing method of a semiconductor device of the present invention is characterized by that the method has at least a process for forming a low dielectric constant film and a process for forming an adhesion reinforcing layer.

In the manufacturing method of a semiconductor device, first of all in the process for forming a low dielectric constant film, a low dielectric constant film is formed on a processed substrate on which a multi-layer wiring is being formed. Then, in the process for forming a low dielectric constant film, an adhesion reinforcing layer is formed with the material for forming an adhesion reinforcing layer before or after the process for forming a low dielectric constant film. Here, when the adhesion reinforcing layer formation process takes place after the process for forming a low dielectric constant film, the adhesion reinforcing layer is formed over the low dielectric constant film. Furthermore, when the process for forming an adhesion reinforcing layer takes place before and after process for forming a low dielectric constant film, the adhesion reinforcing layer, the low dielectric constant layer and the adhesion reinforcing layer are laminated in this order over the processed substrate. As a result, debonding of the low dielectric constant film is prevented. In addition, the reduction of the parasitic capacitance between the wiring and the reduction in the wiring resistance may be achieved, and a high-performance semiconductor device which is capable of increasing the signal transmission speed may be efficiently manufactured. The manufacturing method of a semiconductor device is especially preferable for the production of a semiconductor device of the present invention.

A semiconductor device of the present invention is characterized by that it is manufactured according to the manufacturing method of a semiconductor device of the present invention. Since the semiconductor device includes the adhesion reinforcing layer of the present invention, the debonding of the low dielectric constant film is prevented. Moreover, since the reduction of the parasitic capacitance between the wiring and the reduction in the wiring resistance may be achieved, it is particularly preferable for a flash memory, a DRAM, an FRAM and a MOS transistor, which are high-speed and highly reliable.

DESCRIPTION OF THE PREFERRED EMBODIMENTS (Material for Forming an Adhesion Reinforcing Layer)

The material for forming an adhesion reinforcing layer of the present invention includes at least any one of organoalkoxysilane having a basic functional group, a basic additive and organoalkoxysilane, and it further includes other components according to requirements.

The basicity of the material for forming an adhesion reinforcing layer is maintained by introducing a basic functional group to the organoalkoxysilane and using the organoalkoxysilane having the basic functional group, or by using a basic additive in addition to the organoalkoxysilane, and adhesion and preservation stability are provided to the material for forming an adhesion reinforcing layer of the present invention, —Organoalkoxysilane—

The organoalkoxysilane is not particularly restricted and can be appropriately selected according to applications. Examples thereof include tetraalkoxysilane compounds such as tetramethoxysilane, tetraethoxysilane, tetrapropoxysilane, tetrabutoxysilane and tetraphenoxysilane; alkylalkoxysilane compounds such as methyltrimethoxysilane, methyltriethoxysilane, methyltripropoxysilane, methyltributoxysilane, methyltriphenoxysilane, ethyltrimethoxysilane, ethyltriethoxysilane, ethyltripropoxysilane, ethyltributoxysilane, ethyltriphenoxysilane, dimethyldimethoxysilane, dimethyldiethoxysilane, dimethyldipropoxysilane, dimethyldibutoxysilane, dimethyldiphenoxysilane, diethyldimethoxysilane, diethyldiethoxysilane, diethyldipropoxysilane, diethyldibutoxysilane and diethyldiphenoxysilane; alkenylalkoxysilane compounds such as vinyltributoxysilane, vinyltriethoxysilane, vinyltripropoxysilane, vinyltributoxysilane, vinyltriphenoxysilane, allyltrimethoxysilane, octenyltrimethoxysilane, divinyldimethoxysilane, styryltrimethoxysilane; arylalkoxysilane compounds such as phenyltrimethoxysilane, phenyltriethoxysilane, phenyltripropoxysilane, phenyltributoxysilane and phenyltriphenoxysilane.

The basic functional group is not restricted as long as it provides basicity to the material for forming an adhesion reinforcing layer, and it may be appropriately selected according to requirements. However, a nitrogen-containing basic functional group is preferable in terms of high affinity with the organoalkoxysilane.

The nitrogen-containing basic functional group is not restricted and can be appropriately selected according to applications. Examples thereof include a primary amine, a secondary amine and a tertiary amine.

Organoalkoxysilane including the nitrogen-containing basic functional group is not restricted and can be appropriately selected according to applications. Examples thereof include 3-aminopropyltrimethoxysilane, 3-aminopropyltriethoxysilane, 3-aminopropylmethyldimethoxysilane, 3-aminopropylmethyldiethoxysilane, 2-aminoethyl-3-aminopropyltrimethoxysilane, 2-aminoethyl-3-aminopropyltriethoxysilane, 2-aminoethyl-3-aminopropylmethyldimethoxysilane and 2-aminoethyl-3-aminopropylmethyldiethoxysilane. These may be used alone or in combination of two or more.

The organoalkoxysilane is preferably an oligomer which is produced by hydrolysis and condensation of an alkoxy group. In this case, the adhesion, coating properties and preservation stability of the material for forming an adhesion reinforcing layer improve.

The method for verifying the existence of the oligomer is not restricted and can be appropriately selected according to applications. For example, an analysis by means of Gel Permeation Chromatography (GPC) may be used.

The weight average molecular weight of the oligomer is not restricted and can be appropriately selected according to applications. It is preferably 100 to 100,000, and more preferably 200 to 100,000.

When the weight average molecular weight is less than 100 or over 100,000, a uniform film formation may be difficult.

The oligomer may be used in its own as a stock solution or may be used by dissolving in a solvent.

When the oligomer is used by dissolving in a solvent, the concentration of the oligomer is not restricted and can be appropriately selected according to applications. The concentration is preferably 0.1% by mass or less, and more preferably less than 0.1% by mass.

When the concentration of the oligomer exceeds 0.1% by mass, the adhesion reinforcing layer formed by the condensation of the oligomer thickens, which tends to cause the reduction in the adhesion as well as the increase in the dielectric constant of an inter-layer insulating film (the low dielectric constant film) as a whole.

—Basic Additive—

The basic additive is not restricted as long as the basic additive gives basicity to the material for forming an adhesion reinforcing layer, and it can be appropriately selected according to applications. Examples thereof include sodium hydroxide, potassium hydroxide, lithium hydroxide, pyridine, pyrrole, piperazine, pyrrolidine, piperidine, picoline, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydroxide, tetrabutylammonium hydroxide, ammonia, methylamine, ethylamine, propylamine, butylamine, pentylamine, hexylamine, pentylamine, octylamine, nonylamine, decylamine, N,N-dimethylamine, N,N-diethylamine, N,N-dipropylamine, N,N-dibutylamine, trimethylamine, triethylamine, tripropylamine, tributylamine, cyclohexylamine, trimethylimidine, 1-amino-3-methylbutane, dimethylglycine and 3-amino-3-methylamine. These may be used alone or in combination of two or more. Among these, an organic amine such as amino alcohol is particularly preferable for its superior adhesion to the processed substrate.

The basic additive may be used in its own as a stock solution or may be used by dissolved in a solvent.

When the basic additive is used by dissolving in a solvent, the amount of the basic additive is not restricted and can be appropriately selected according to applications. The amount is preferably 0.5% by mass to 20% by mass, and more preferably 1% by mass to 15% by mass.

When the amount of the basic additive is less than 0.5% by mass or exceeds 20% by mass, there are cases in which sufficient adhesion and preservation stability may not be achieved.

The solvent for dissolving the oligomer and the basic additive is not restricted as long as it can dissolve the oligomer and the basic additive, and it can be appropriately selected according to applications. Examples thereof include alcohols such as methyl alcohol, ethyl alcohol, propyl alcohol, isopropyl alcohol, butyl alcohol, isobutyl alcohol and tert-butyl alcohol; phenols such as phenol, cresol, diethylphenol, triethylphenol, propylphenol, nonylphenol, vinylphenol and allylphenol; ketones such as cyclohexanone, methyl isobutyl ketone and methyl ethyl ketone; cellosolves such as methyl cellosolve and ethyl cellosolve; hydrocarbons such as hexane, octane and decane; and glycols such as propylene glycol, propylene glycol monomethyl ether and propylene glycol monomethyl ether acetate. Among these, solvents which can control the progress of the hydrolysis reaction and has an identical component as the product obtained by the hydrolysis of the alkoxy group in the organoalkoxysilane is particularly preferable. For example, methyl alcohol is preferable as the solvent when the alkoxy group is a methyl group.

—Other Components—

The other components are not restricted as long as it does not inhibit the effect of the present invention. It can be appropriately selected according to applications, and hitherto known various additives are given as examples.

The content of the other component in the material for forming an adhesion reinforcing layer may be determined according to the types and the content of the organoalkoxysilane and the basic additive.

The material for forming an adhesion reinforcing layer of the present invention gives superior adhesion between inorganic materials and can reinforce the adhesion between the low dielectric constant film containing an inorganic material and other members since it includes at least organoalkoxysilane, shows basicity and exhibits favorable preservation stability. Therefore, it may be favorably used for the formation of an adhesion reinforcing layer which gives adhesion to the low dielectric constant film, and in addition it may be favorably used for the adhesion reinforcing layer of the present invention and the production of a semiconductor device of the present invention described hereinafter.

(Adhesion Reinforcing Layer)

The adhesion reinforcing layer of the present invention is formed with the material for forming an adhesion reinforcing layer of the present invention.

Physical properties such as shape, structure and size of the adhesion reinforcing layer are not restricted and can be appropriately selected according to applications; the adhesion reinforcing layer preferably has the following thickness and nitrogen content which are suitable for a semiconductor device.

The shape is not restricted and can be appropriately selected according to applications. Examples thereof include a solid film shape formed on the whole area of the processed substrate and a patterned form.

As an example of the method for forming an adhesion reinforcing layer with a solid film form, the processed substrate is immersed in the material for forming an adhesion reinforcing layer, and a solid adhesion reinforcing layer is formed on the whole area of the surface of the processed substrate.

As an example of the method for forming a patterned adhesion reinforcing layer, a patterned adhesion reinforcing layer is formed by forming a resist pattern such as a line on the surface of the processed substrate and then by coating the material for forming an adhesion reinforcing layer. Another example is a dry or wet etching after the formation of a solid adhesion reinforcing layer followed by application of a resist and formation of a desired pattern.

The structure is not restricted and can be appropriately selected according to applications. It may be, for example, a single-layer structure or a laminated structure.

The nitrogen content in each pattern and in each layer may be identical or different from one another when the adhesion reinforcing layer has a patterned form and the laminated structure.

The size is not restricted and may be appropriately selected according to applications. The adhesion reinforcing layer preferably has a size compatible with the size of an existing semiconductor device and low dielectric constant film when it is used for the purpose of reinforcing the adhesion of the low dielectric constant film in a semiconductor device.

The thickness is not restricted and can be appropriately selected according to applications. When, for example, the adhesion reinforcing layer is used as a layer to reinforce the adhesion of the low dielectric constant film, the thickness is preferably 0.5 nm to 50 nm, and more preferably 1 nm to 30 nm due to the structure.

When the thickness is less than 0.5 nm or exceeds 50 nm, the adhesion may be reduced.

The nitrogen content of the adhesion reinforcing layer is not restricted and can be appropriately selected according to applications. It is, for example, preferably 20% by mass or less, and more preferably 15% by mass or less.

The nitrogen content exceeding 20% by mass may raise the dielectric constant and inhibit the increase of the signal transmission speed.

A method for measuring the nitrogen content is not restricted and can be appropriately selected according to applications. The nitrogen content may be measured by, for example, SEM-EDX and TEM-EDX.

The method for forming an adhesion reinforcing layer is not restricted and can be appropriately selected according to applications. A heretofore known method such as coating may be used. The coating method is not restricted and can be appropriately selected from known coating methods according to applications. The spin coating method is given as a preferable example. The conditions for the spin coating method are, for example: the number of revolutions is about 100 rpm to 10,000 rpm, and preferably 800 rpm to 5,000 rpm; the time period is about one second to 10 minutes, and preferably one second to 90 seconds.

The position at which the adhesion reinforcing layer is formed is not restricted and can be appropriately selected according to applications. It is preferably between the processed substrate on which multi-layer wiring is to be formed and the low dielectric constant film as well as between the low dielectric constant film and other members such as the copper barrier film which is formed on the low dielectric constant film. In these cases, the adhesion between the low dielectric constant film and the processed substrate or other members may be reinforced even when the low dielectric constant film is porous having a small contact area. Therefore, the occasion of the debonding of the low dielectric constant film may be suppressed.

The adhesion reinforcing layer of the present invention exhibits superior adhesion and enables strong bonding between inorganic materials since it is formed with the material for forming an adhesion reinforcing layer of the present invention. Therefore, it may be preferably used for the formation of a multi-layer wiring by arranging it between the low dielectric constant film and the copper barrier film. Also, the debonding of the low dielectric constant film is prevented, and the increase of the signal transmission speed is possible. Therefore, the adhesion reinforcing layer is particularly suitable for a semiconductor integrated circuit which requires an increase in the response speed.

(Semiconductor Device and Manufacturing Method Thereof)

The manufacturing method of a semiconductor device according to the present invention includes at least a process for forming a low dielectric constant film and a process for forming an adhesion reinforcing layer; and it additionally includes other processes appropriately selected according to requirements.

<Process for Forming Low Dielectric Constant Film>

The process for forming a low dielectric constant film is a process forming a low dielectric constant film on the processed substrate.

The process for forming a low dielectric constant film is not restricted in terms of the material for the low dielectric constant film and the method of forming the low dielectric constant film as long as it can form the low dielectric constant film. Although it can be appropriately selected according to applications, it preferably includes a coating process, a heating process and a baking process.

—Coating Process—

The coating process is a process to apply a material for forming a low dielectric constant film on the processed substrate.

The material for forming a low dielectric constant film is a material which can form a film having low dielectric constant such as insulating film, and it is a liquid composition having an organosilicon compound obtained through hydrolysis of tetraalkylorthosilicate (TAOS) and alkoxysilane (AS) represented by General Formula (1) below under the presence of tetraalkyl ammonium hydroxide (TAAOH):

$X_n Si(OR)_{4-n}$  General Formula (1)

where in General Formula (1) X represents any one of a hydrogen atom, a fluorine atom, an alkyl group with a carbon number of one to eight, a fluorine-substituted alkyl group, an aryl group and a vinyl group, R represents any one of a hydrogen atom, an alkyl group with a carbon number of one to eight, an aryl group and a vinyl group, and n is an integer of zero to three.

The tetraalkylorthosilicate (TAOS) is not restricted and can be appropriately selected according to applications. Examples thereof include tetramethylorthosilicate, tetraethylorthosilicate, tetrapropylorthosilicate, tetraisopropylorthosilicate and tetrabutylorthosilicate. These may be used alone or in combination of two or more. Among these, tetraethylorthosilicate (TEOS), tetramethylorthosilicate (TMOS) and a mixture thereof are preferable in view of achieving a coating layer with low dielectric constant as well as high strength.

The alkoxysilane (AS) is not restricted and can be appropriately selected according to applications. Examples thereof include methyltrimethoxysilane, methyltriethoxysilane, methyltriisopropoxysilane, ethyltrimethoxysilane, ethyltriethoxysilane, ethyltriisopropoxysilane, octyltrimethoxysilane, octyltriethoxysilane, vinyltrimethoxysilane, vinyltriethoxysilane, phenyltrimethoxysilane, phenyltriethoxysilane, trimethoxysilane, triethoxysilane, triisopropoxysilane, fluorotrimethoxysilane, fluorotriethoxysilane, dimethyldimethoxysilane, dimethyldiethoxysilane, diethyldimethoxysilane, diethyldiethoxysilane, dimethoxysilane, diethoxysilane, difluorodimethoxysilane, difluorodiethoxysilane, trifluoromethyltrimethoxysilane, trifluorodimethyltriethoxysilane and trifluoromethyltriethoxysilane. These may be used alone or in combination of two or more. Among these methyltrimethoxysilane (MTMS), methyltriethoxysilane (MTES) and a mixture thereof are preferable in view of achieving a coating layer with low dielectric constant as well as high strength.

The tetraalkyl ammonium hydroxide (TAAOH) is not restricted and can be appropriately selected according to applications. Examples thereof include tetramethylammonium hydroxide, tetraethylammonium hydroxide, tetrapropylammonium hydroxide, tetrabutylammonium hydroxide, tetra-n-octylammonium hydroxide, n-hexadecyltrimethylammonium hydroxide and n-octadexyltrimethylammonium hydroxide. These may be used alone or in combination of two or more. Among these, tetrapropylammonium hydroxide (TPAOH), tetrabutylammonium hydroxide (TBAOH) and a mixture thereof are preferable in view of achieving a coating layer with low dielectric constant as well as high strength.

The tetraalkyl ammonium hydroxide (TAAOH) may be synthesized accordingly, or it may be a commercial product. It is preferable that the content of impurities composed of a compound of alkali metal elements such as sodium and potassium is 50 ppb by mass or less respectively on an atomic basis and that the content of impurities composed of a compound of halogen elements such as bromine and chlorine is 1 ppm by mass or less respectively on an atomic basis.

When the content of the impurities composed of a compound of alkali metal elements exceeds 50 ppb by mass, these elements may diffuse into the transistor portion arranged on the semiconductor substrate and cause the degradation of the transistor. When the content of the impurities composed of a compound of halogen elements exceeds 1 ppm, aluminum wiring and copper wiring arranged on the semiconductor substrate may corrode.

In addition, when the content of the impurities composed of a compound of alkali metal elements exceeds 50 ppb by mass, the impurities act as a catalyst during hydrolysis of tetraalkylorthosilicate (TAOS) and alkoxysilane (AS) represented by General Formula (1) above under the presence of tetraalkyl ammonium hydroxide (TAAOH), and the obtained organosilicon compound is crystalline silica in a zeolite form. Therefore, the low dielectric constant film formed on the processed substrate is a zeolite crystalline material with asperity on the surface of the coating layer, and a smooth surface may not be obtained.

Given this factor, the impurities is preferably removed beforehand to maintain the content of the impurities within the range when the tetraalkyl ammonium hydroxide (TAAOH) having impurities over the above-mentioned content is used.

The method for removing the impurities is not restricted and can be appropriately selected according to applications. For example, by processing the commercially-available tetraalkyl ammonium hydroxide (TAAOH) using a cation exchange resin and a anion exchange resin, impurities composed of a compound of alkali metal elements such as sodium and potassium as well as a compound of halogen elements such as bromine and chlorine may be removed for high purity.

The molar ratio of the tetraalkylorthosilicate (TAOS) to the alkoxysilane (AS), i.e. TAOS/AS, is not restricted and can be appropriately selected according to applications. It is preferably 6/4 to 2/8, and more preferably 5/5 to 3/7, on a $SiO_2$ conversion basis.

When the molar ratio (TAOS/AS) is less than 2/8, the relative dielectric constant of 2.5 or less may not be achieved because the template effect by the tetraalkyl ammonium hydroxide (TAAOH) is reduced and the number of pores (pore volume) decreases. When it exceeds 6/4, the hydrophobic property of the obtained low dielectric constant film may degrade.

The molar ratio of the tetraalkyl ammonium hydroxide (TAAOH) to the liquid composition having a organosilicon compound (the composition for forming a low dielectric constant film; TAOS+AS), i.e. TAAOH/(TAOS+AS), is not restricted and can be appropriately selected according to applications. It is preferably 1/10 to 7/10, and more preferably 1/10 to 6/10, on a $SiO_2$ conversion basis.

When the molar ratio (TAAOH/(TAOS+AS)) is less than 1/10, the relative dielectric constant of 2.5 or less may not be achieved because the functionality as a template material is weak and the number of pores (pore volume) decreases. When it exceeds 7/10, a low dielectric constant film with high film strength having a modulus of elasticity of 5.0 GPa or greater may not be obtained because the functionality as a template material is strong and the number of pores (pore volume) formed in the coating layer increases.

Next, an example of a method for preparing the liquid composition having an organosilicon compound is explained in detail.

First, the tetraalkylorthosilicate (TAOS) and the alkoxysilane (AS) represented by General Formula (1) above are mixed with an organic solvent and then agitated at a temperature of 10° C. to 30° C. and a speed of 100 rpm to 200 rpm until these components are sufficiently mixed.

Next, a solution of the tetraalkyl ammonium hydroxide (TAAOH) is delivered by drops into the mixed solution under agitation over 5 minutes to 20 minutes, and then the mixed solution is agitated further at a temperature of 10° C. to 30° C. and a speed of 100 rpm to 200 rpm over 30 minutes to 90 minutes.

Furthermore, by heating the solution to 30° C. to 80° C. and then agitating at a speed of 100 rpm to 200 rpm over one hour to 72 hours while maintaining the temperature, a liquid composition having an organosilicon compound as a hydrolysate of the tetraalkylorthosilicate (TAOS) and the alkoxysilane (AS) can be prepared.

Here, the mixed solution of TAOS and AS may be delivered by drops into the TAAOH instead of delivering the tetraalkyl ammonium hydroxide (TAAOH) to the mixed solution of the tetraalkylorthosilicate (TAOS) and the alkoxysilane (AS) represented by General Formula (1) above.

The organic solvent is not restricted and can be appropriately selected according to applications. Examples thereof include alcohols, glycols, ketones, cellosolves, ethers, esters and hydrocarbons.

Examples of the alcohols include methanol, ethanol, propanol and butanol.

Examples of the glycols include ethylene glycol, propylene glycol and hexylene glycol.

Examples of the ketones include methyl ethyl ketone and methyl isobutyl ketone.

Examples of the cellosolves include methyl cellosolve and ethyl cellosolve.

Examples of the ethers include glycol ethers such as propylene glycol monopropyl ether.

Examples of the esters include methyl acetate, ethyl acetate, methyl lactate and ethyl lactate.

Examples of the hydrocarbons include hexane, cyclohexane and octane. Other than these, aromatic hydrocarbons such as toluene, xylene and mesitylene may be used.

The organic solvent may be used alone or in combination of two or more. Among the organic solvents, the alcohols with high solubility of TAOS or AS are particularly preferable.

The used amount the organic solvent is not restricted and can be appropriately selected according to applications. The mixing ratio on a mass basis to the liquid composition having the organosilicon compound (TAOS+AS), i.e., the organic solvent/(TAOS+AS), is preferably 1/1 to 3/1, and more preferably 1/1 to 2.5/1.

The solution of the tetraalkyl ammonium hydroxide (TAAOH) includes preferably 5% by mass to 40% by mass, and more preferably 10% by mass to 30% by mass, of tetraalkyl ammonium hydroxide (TAAOH) in distilled water or ultrapure water. Here, the water included in the solution of the tetraalkyl ammonium hydroxide (TAAOH) is used to initiate the hydrolysis reaction of the tetraalkylorthosilicate (TAOS) and alkoxysilane (AS); therefore, it is necessary that the solution includes water with the amount sufficient for hydrolysis reaction.

Also, the tetraalkyl ammonium hydroxide (TAAOH) assumes a function as a catalyst which promotes the hydrolysis reaction; therefore, no external addition of other catalysts such as ammonia is required.

The reaction condition of the hydrolysis is not restricted and can be appropriately selected according to applications. The reaction temperature is preferably 30° C. to 80° C., and more preferably 35° C. to 60° C. The agitation time is, for example, preferably one hour to 72 hours, and more preferably 10 hours to 48 hours.

The number average molecular weight of the organosilicon compound (the hydrolysate of TAOS and AS) included in the liquid composition obtained by the preparation method is not restricted and can be appropriately selected according to applications. On a polystyrene conversion basis, for example, it is preferably 500 to 1,000,000, and more preferably 1,000 to 100,000.

When the number average molecular weight is 500 to 1,000,000, it is possible to obtain the liquid composition having superior stability over time as well as favorable coating property.

In addition, in the preparation of the liquid composition, the liquid composition may include according to requirements: at least one type of organosilicon compound selected from alkoxysilane represented by General Formula (1) below and halogenated silanes represented by General Formula (2) below, or a hydrolysate thereof; and a polysiloxane which is a reactant with silica particles having a particle diameter of 5 nm to 50 nm.

$X_nSi(OR)_{4-n}$            General Formula (1)

$X_nSiX'_{4-n}$            General Formula (2)

where in General Formulae (1) and (2), X represents any one of a hydrogen atom, a fluorine atom, an alkyl group with a carbon number of one to eight, a fluorine-substituted alkyl group, an aryl group and a vinyl group, R represents any one of a hydrogen atom, an alkyl group with a carbon number of one to eight, an aryl group and a vinyl group, X' represents a halogen atom, and n is an integer of zero to three.

The silica particles may be obtained by mixing at least one type of alkoxysilanes of General Formula (1) above in the organic solvent for hydrolysis and condensation polymerization under the presence of water and ammonia.

Here, when a liquid composition including polysiloxane (PS) obtained by reacting on the surface of the silica particles the hydrolysate of the alkoxysilane and halogenated silane is coated on the processed substrate, it is known that a coating layer having small relative dielectric constant of 3.0 or less as well as relatively superior hydrophobic property may be obtained (JP-A No. H09-315812).

Regarding the content of the polysiloxane, the mixing ratio on a mass basis to the liquid composition (the component for forming a low dielectric constant film: TAOS+AS), i.e., PS/(TAOS+AS), is preferably 1/3 or less, and more preferably 1/4 or less, on a $SiO_2$ conversion basis.

When the mixing ratio on a mass basis (PS/(TAOS+AS)) exceeds 1/3, the film strength of the formed low dielectric constant film is reduced, and high film strength having a modulus of elasticity of 5.0 GPa or greater may not be obtained because the quantity of the tetraalkylorthosilicate (TAOS) decreases and the template effect by the tetraalkyl ammonium hydroxide (TAAOH) is reduced. Moreover, the relative dielectric constant increases, and the relative dielectric constant of 2.5 or less may not be achieved.

When a liquid composition having an organosilicon compound as the hydrolysate of the tetraalkylorthosilicate (TAOS) and alkoxysilane (AS), or a liquid composition having a polysiloxane (PS) and an organosilicon compound as the hydrolysate of the tetraalkylorthosilicate (TAOS) and alkoxysilane (AS) is used, the content of the component for forming a low dielectric constant in the liquid compositions is not restricted and can be appropriately selected according to applications. It is on a $SiO_2$ conversion basis preferably 2% by mass to 40% by mass, and more preferably 5% by mass to 20% by mass.

When the content is less than 2% by mass, it may become difficult to form a uniform coating layer. When it exceeds 40% by mass, the stability of the coating solution over time may degrade.

Although it may be used as it is, the liquid composition is preferably used by adjusting the composition of the component for forming a low dielectric constant film to the above-mentioned level after a solvent exchange of the organic solvent component included in the liquid compositions with an organic solvent selected from propylene glycol monopropyl ether (PGP) and propylene glycol monomethyl ether acetate (PGMEA) using a rotary evaporator. The solvent exchange separates and removes the organic solvent and moisture included in the liquid compositions and further the alcohols as by-products of the hydrolysis of, for example, alkoxysilane (AS). At this point, it is preferable to have the organic solvent and the moisture contained before the solvent exchange remain in the liquid compositions by about 1% by mass to 30% by mass, respectively. As a result, a liquid composition which enables the formation of the low dielectric constant film with a smooth surface having high film strength and superior hydrophobic property may be obtained.

In addition, regarding the liquid composition, an organosilicon compound may be used, which can be obtained by hydrolysis or partial hydrolysis of the tetraalkylorthosilicate (TAOS) under the presence of tetraalkyl ammonium hydroxide (TAAOH), followed by mixing with substances such as alkoxysilane (AS) represented by General Formula (1) below, hydrolysate of the alkoxysilane and partial hydrolysate of the alkoxysilane, and by optional hydrolysis of a portion of these substances:

General Formula (1)

where in General Formula (1) X represents any one of a hydrogen atom, a fluorine atom, an alkyl group with a carbon number of one to eight, a fluorine-substituted alkyl group, an aryl group and a vinyl group, R represents any one of a hydrogen atom, an alkyl group with a carbon number of one to eight, an aryl group and a vinyl group, and n is an integer of zero to three.

Here, the details of the tetraalkylorthosilicate (TAOS), the alkoxysilane (AS) and the tetraalkyl ammonium hydroxide (TAAOH) are as described above.

Next, another exemplary method for preparing a liquid composition including the organosilicon compound is described in more detail.

First, the tetraalkylorthosilicate (TAOS) is mixed with the organic solvent and then agitated at a temperature of 10° C. to 30° C. and a speed of 100 rpm to 200 rpm until these components are sufficiently mixed.

Next, a solution of the tetraalkyl ammonium hydroxide (TAAOH) is delivered by drops into the mixed solution under agitation over 5 minutes to 20 minutes, and then the mixed solution is agitated further at a temperature of 10° C. to 30° C. and a speed of 100 rpm to 200 rpm over 30 minutes to 90 minutes.

Furthermore, by heating the mixed solution to a temperature of 30° C. to 80° C. and then agitating at a speed of 100 rpm to 200 rpm over 0.5 hours to 72 hours while maintaining the temperature, a mixed solution having a hydrolysate or a partial hydrolysate of the tetraalkylorthosilicate (TAOS) is prepared. After it is mixed with alkoxysilane (AS) represented by General Formula (1) above or a mixture of alkoxysilane (AS) with the organic solvent, the mixed solution is agitated at a speed of 100 rpm to 200 rpm and a temperature of 10° C. to 30° C. until these components are sufficiently mixed. Then, after a solution of tetraalkyl ammonium hydroxide (TAAOH) is delivered by drops into the mixed solution under agitation over 5 minutes to 20 minutes, the mixed solution is agitated further at a temperature of 10° C. to 30° C. and a speed of 100 rpm to 200 rpm over 30 minutes to 90 minutes. Then, by heating the solution obtained to a temperature of 30° C. to 80° C. followed by agitation at a speed of 100 rpm to 200 rpm over 10 hours to 30 hours while maintaining the temperature, a liquid composition including an organosilicon compound, which is a hydrolysate of the tetraalkylorthosilicate (TAOS) and the alkoxysilane (AS), is obtained.

Here, instead of dropping the TAAOH solution to the mixed solution having the TAOS and the organic solvent, a mixed solution having the tetraalkylorthosilicate (TAOS) and the organic solvent may be delivered slowly by drops into the solution of the tetraalkyl ammonium hydroxide (TAAOH) over 30 minutes to 90 minutes under the same condition as above.

Furthermore, yet another exemplary method for preparing a liquid composition including the organosilicon compound is explained in detail.

First, the tetraalkylorthosilicate (TAOS) is mixed with the organic solvent and then agitated at a temperature of 10° C. to 30° C. and a speed of 100 rpm to 200 rpm until these components are sufficiently mixed.

Next, a solution of the tetraalkyl ammonium hydroxide (TAAOH) is delivered by drops into the mixed solution under agitation over 5 minutes to 20 minutes, and then the mixed solution is agitated further at a temperature of 10° C. to 30° C. and a speed of 100 rpm to 200 rpm over 30 minutes to 90 minutes.

Furthermore, by heating the mixed solution to a temperature 30° C. to 80° C. and then agitating at a speed of 100 rpm to 200 rpm over 0.5 hours to 72 hours while maintaining the temperature, a mixed solution having a hydrolysate or a partial hydrolysate of the tetraalkylorthosilicate (TAOS) is prepared.

In the mean time, alkoxysilane represented by General Formula (1) above is mixed with the organic solvent, and it is then agitated at a speed of 100 rpm to 200 rpm and a temperature of 10° C. to 30° C. until these components are sufficiently mixed.

Then, after the tetraalkyl ammonium hydroxide (TAAOH) solution is delivered by drops into the mixed solution under agitation over 5 minutes to 20 minutes, the mixed solution is agitated further at a temperature of 10° C. to 30° C. and a speed of 100 rpm to 200 rpm over 30 minutes to 90 minutes.

Furthermore, by heating the solution to a temperature of 30° C. to 80° C. followed by agitation at a speed of 100 rpm to 200 rpm over 0.5 hours to 72 hours while maintaining the temperature, a mixed solution of a hydrolysate or partial hydrolysate including the alkoxysilane (AS) is prepared.

Then, the mixed solution including the hydrolysate or partial hydrolysate of tetraalkylorthosilicate (TAOS) and the mixed solution including the hydrolysate or partial hydrolysate of alkoxysilane (AS) are mixed and then agitated at a speed of 100 rpm to 200 rpm and a temperature of 10° C. to 30° C. until these components are sufficiently mixed.

Furthermore, according to requirements, by heating it to 30° C. to 80° C. and then agitating at a speed of 100 rpm to 200 rpm over 10 hours to 30 hours while maintaining the temperature, a liquid composition having an organosilicon compound as a hydrolysate of the tetraalkylorthosilicate (TAOS) and the alkoxysilane (AS) can be prepared.

Here, instead of dropping the TAAOH solution to the mixed solution having the TAOS and the organic solvent or dropping the TAAOH solution to the mixed solution having the AS and the organic solvent, the mixed solution of the tetraalkylorthosilicate (TAOS) and the organic solvent may be delivered slowly into the to solution of the tetraalkyl ammonium hydroxide (TAAOH) over 30 minutes to 90 minutes under the same conditions as above, or the mixed solution of the alkoxysilane (AS) and the organic solvent may be delivered slowly into the to solution of the tetraalkyl ammonium hydroxide (TAAOH) over 30 minutes to 90 minutes under the same conditions as above.

The coating method is not restricted and can be appropriately selected from heretofore known coating methods according to applications. Examples thereof include the spin coating method, the dip coating method, the roll coating method and the transfer method. Among these, the spin coating method is preferable for coating a semiconductor substrate since it is superior in terms of the uniform thickness of a coated film as well as low dust generation. The conditions for the spin coating method are, for example: the number of revolutions is about 100 rpm to 10,000 rpm, and preferably 800 rpm to 5,000 rpm; the time period is about one second to 10 minutes, and preferably one second to 90 seconds.

The transfer method may be used for coating a semiconductor substrate with a large diameter.

The thickness of the coating is not restricted and can be appropriately selected according to applications; for example, it is preferably 10 nm or greater, and more preferably 50 nm or greater.

When the thickness is less than 10 nm, a defect such as pinhole may occur.

It is preferable to bake (heat and dry) the coated resist composition during or after the coating. The conditions and the methods are not restricted as long as the resist film is not softened, and they can be appropriately selected according to applications. For example, the temperature is preferably 40° C. to 150° C., more preferably 80° C. to 120° C.; the time period is preferably 10 seconds to five minutes, and more preferably 30 seconds to 90 seconds.

The processed substrate is not restricted and can be appropriately selected according to applications. Examples of the processed substrate for forming the low dielectric constant film on a semiconductor device include a semiconductor substrate. More specifically, preferable examples include a substrate such as silicon wafer and various oxidized films.

The material for forming a low dielectric constant film is coated on the processed substrate by means of the above-mentioned process.

—Heating Process—

The heating process is a process to heat the film composed of the liquid composition including the organosilicon compound and coated on the processed substrate in the coating process at a temperature of 80° C. to 350° C.

The temperature for heating the film composed of the liquid composition is not restricted as long as it is 80° C. to 350° C., and it can be appropriately selected according to applications. It is preferably 100° C. to 350° C.

When the heating temperature is lower than 80° C., the organic solvent in the film composed of the liquid composition including the organosilicon compound hardly evaporates and remains in the film. Therefore, the film cannot be made porous, and the film surface may become uneven. When the temperature exceeds 350° C., the organic solvent in the film evaporates drastically to form pores with a relatively large diameter as well as voids. As a result, the film strength may decrease substantially.

The time period for heating in the heating process varies depending on the film thickness of the film; for example, it is about one minute to 10 minutes, and preferably two minutes to five minutes.

Moreover, the heating process preferably takes place by placing the processed substrate having a film formed in the coating process on, for example, a sheet-feed heated plate.

The heating process is performed under conditions such as nitrogen gas atmosphere and air atmosphere as inert gases, and it is preferably performed under air atmosphere. In this case, the possibility of the trace oxygen entrained in the film increases. Therefore, an amorphous silica film which has low dielectric constant and is highly cross-linked with Si—O—Si bonding is formed, and an amorphous silica film with low dielectric constant having moisture-absorption resistance (hydrophobic property) and high film strength may be easily formed. Here, since it is performed in a short period of time under a low temperature condition of 350° C. or less, the heating process does not have an adverse effect such as metal oxidation on the metal wiring arranged on a semiconductor substrate even under the air atmosphere including a relatively large quantity of oxygen.

By means of the above-mentioned process, the film composed of the liquid composition including the organosilicon compound is heated to boil off the organic solvent included in the film as well as to decompose and detach the tetraalkyl ammonium hydroxide (TAAOH) included in the film. Also, a polymerization reaction of the silica film-formation component as a solid content progresses to harden the film, and at the same time the heating decreases the melt viscosity of the polymer and increases the reflow property of the film to improve the uniformity of the obtained film.

—Baking Process—

The baking process is a process for baking the film heated in the heating process at a temperature of higher than 350° C. and 450° C. or below.

The temperature for baking in the baking process varies depending on the type and the quantity of the tetraalkyl ammonium hydroxide (TAAOH) used for the liquid composition including the organosilicon compound or the properties of the organosilicon compound included in the liquid composition. It should be higher than 350° C. and not higher than 450° C. in terms of obtaining an amorphous silica film with low dielectric constant having moisture-absorption resistance (hydrophobic property) and high film strength; it is preferably 370° C. to 450° C.

The temperature for baking of 350° C. or less may inhibit the progress of the cross-linking reaction of a precursor for the silica film formation component, and as a result sufficient film strength may not be obtained. The temperature exceeding 450° C. may oxidize or melt the aluminium wiring and copper wiring arranged on a semiconductor substrate and cause damages to these wirings.

The time period for baking in the baking process varies depending on the type of the organosilicon compound and the film thickness of the film. It is about five minutes to 90 minutes, and preferably 10 minutes to 60 minutes.

Moreover, the baking process preferably takes place, similarly to the heating process, by placing the processed substrate having the film on, for example, a sheet-feed heated plate.

The baking process is preferably performed under inert gas atmosphere.

The inert gas is not restricted and can be appropriately selected according to applications. It is preferably a nitrogen gas in terms of the low reactivity with the precursor and baked materials. Also, oxygen gas and air may be optionally added to the nitrogen gas according to requirements, and an inert gas with a small quantity of oxygen (for example, oxygen of about 500 ppm by volume to 10,000 ppm by volume) may be used (for example, International Publication No. WO01/48806).

The film is baked to form a low dielectric constant film by means of the above-mentioned process.

The relative dielectric constant of the low dielectric constant film is not restricted and can be appropriately selected according to applications. It is preferably 2.5 or less in view of the capability to increase the signal transmission speed.

The modulus of elasticity of the low dielectric constant film is not restricted and can be appropriately selected according to applications. It is preferably 5.0 GPa or greater, and more preferably 6.0 GPa or greater in view of suppressing the deformation and breaking of wiring or the destruction of the insulating film caused by stress concentration.

The hardness of the low dielectric constant film is not restricted and can be appropriately selected according to applications. It is preferably 0.6 GPa or greater, and more preferably 0.7 GPa or greater in view of suppressing the deformation and breaking of wiring or the destruction of the insulating film caused by stress concentration.

The modulus of elasticity and the hardness may be measured by, for example, an indentation hardness tester such as Nano Indenter XP manufactured by Nano Instruments.

Also, the average pore diameter of the pores included in the film is 3 nm or less, and the pore content of micropores having a pore diameter of 2 nm or less is 70% or greater.

The thickness of the low dielectric constant film is not restricted and can be appropriately selected according to applications. It is usually 100 nm to 600 nm on a silicon wafer in a semiconductor device, and 100 nm to 1,000 nm between wiring layers in a multi-layer wiring.

<Process for Forming Adhesion Reinforcing Layer>

The process for forming an adhesion reinforcing layer is a process for forming an adhesion reinforcing layer using the material for forming an adhesion reinforcing layer of the present invention.

It is required to perform the process for forming an adhesion reinforcing layer at least before or after the process for forming a low dielectric constant film. In this case, the process for forming an adhesion reinforcing layer may take place only before, only after, or both before and after the process for forming a low dielectric constant film.

When the process for forming an adhesion reinforcing layer takes place before the process for forming a low dielectric constant film, the adhesion reinforcing layer is formed on the processed substrate, over which the low dielectric constant film is further formed. On the other hand, when the process for forming an adhesion reinforcing layer takes place after the process for forming a low dielectric constant film, the adhesion reinforcing layer is formed on the low dielectric constant film. Moreover, when the process for forming an adhesion reinforcing layer takes place before and after the process for forming a low dielectric constant film, the adhesion reinforcing layer, the low dielectric constant film, the adhesion reinforcing layer and other members (the copper barrier film) are laminated in this order on the processed substrate. As a result, debonding of the low dielectric constant film may be prevented, the reduction of the parasitic capacitance between the wiring as well as the reduction in the wiring resistance may be achieved, and finally a high-performance semiconductor device capable of increasing the signal transmission speed may be manufactured efficiently.

The method for forming an adhesion reinforcing layer is not restricted and can be appropriately selected according to applications. It is preferably formed by coating the material for forming an adhesion reinforcing layer of the present invention on the processed substrate followed by baking.

Here, the details of the material for forming an adhesion reinforcing layer, the processed substrate and the coating are as described above.

The baking is performed at a temperature of preferably 150° C. to 250° C., and more preferably 150° C. to 230° C.

The adhesion-enhancing effect may not be achieved with the baking temperature of less than 150° C. since the solvent in the material for forming an adhesion reinforcing layer of the present invention including an oligomer obtained by hydrolysis and condensation of the alkoxy group does not sufficiently vaporize as well as the condensation of the oligomer component does not progress to a satisfactory extent. When the temperature exceeds 250° C., the adhesion-enhancing effect may not be achieved due to thermal decomposition of the adhesion reinforcing layer.

Here, the baking may be performed right after the coating of the material for forming an adhesion reinforcing layer or after the coating process of in the process for forming a low dielectric constant film.

The process for forming the adhesion reinforcing layer preferably includes cleaning of the processed substrate.

The method for cleaning is not restricted and can be appropriately selected according to applications. It preferably employs any one of water and an organic solvent, and it is performed preferably after baking the material for forming an adhesion reinforcing layer. In this case, the unreacted oligomer component is removed after the baking to further improve the adhesion.

The organic solvent is not restricted as long as the organic solvent may dissolve the oligomer component, and it can be appropriately selected according to applications. Examples thereof include alcohols such as methyl alcohol, ethyl alcohol, propyl alcohol, isopropyl alcohol, butyl alcohol, isobutyl alcohol and tert-butyl alcohol; phenols such as phenol, cresol, diethylphenol, triethylphenol, propylphenol, nonylphenol, vinylphenol and allylphenol; ketones such as cyclohexanone, methyl isobutyl ketone and methyl ethyl ketone; cellosolves such as methyl cellosolve and ethyl cellosolve; hydrocarbons such as hexane, octane and decane; and glycols such as propylene glycol, propylene glycol monomethyl ether and propylene glycol monomethyl ether acetate. These may be used alone or in combination of two or more. Among these, alcohols are preferable in terms of the superior solubility with an oligomer component.

The adhesion reinforcing layer is formed using the material for forming an adhesion reinforcing layer by means of the above-mentioned process.

When a semiconductor device having a multi-layer wiring is manufactured with the manufacturing method of a semiconductor device of the present invention, the low dielectric constant film is preferably arranged in contact with its lower layer or its upper layer through the adhesion reinforcing layer. In this case, since the adhesion reinforcing layer provides superior adhesion to the low dielectric constant film, the adhesion of the low dielectric constant film with its lower layer or its upper layer is reinforced. Therefore, debonding with other layers may be suppressed even when the low dielectric constant film is porous with a small contact area.

The lower layer and the upper layer with which the low dielectric constant film contact through the adhesion reinforcing layer is not restricted and can be appropriately selected according to applications. Preferable examples thereof include an $SiO_2$ film, an SiN film, an SiC film, an SiOC film and an SiCN film for view of excellent adhesion-enhancing effect.

Since the adhesion reinforcing layer is formed in contact with the low dielectric constant film, the manufacturing method of a semiconductor device of the present invention may provide superior adhesion to the low dielectric constant film even when the low dielectric constant film is porous with a small contact area. Accordingly, the adhesion of the low dielectric constant film with other layers (films) is reinforced, and debonding of the low dielectric constant film may be suppressed. Therefore, the manufacturing method may be favorably applied to the production of a semiconductor device having a multi-layer wiring, achieving the reduction of the parasitic capacitance between the wiring as well as the reduction in the wiring resistance, and a high-performance semiconductor device with possible increase of the signal transmission speed may be manufactured efficiently. The manufacturing method of a semiconductor device is particularly suitable for the production of a semiconductor device of the present invention.

Since the semiconductor device of the present invention has the adhesion reinforcing layer of the present invention formed with the material for forming an adhesion reinforcing layer of the present invention, debonding of the low dielectric constant film is prevented. Moreover, the reduction of the parasitic capacitance between the wiring as well as the reduction in the wiring resistance may be achieved. Therefore, it is particularly suitable for a high-speed semiconductor device with high reliability such as flash memory, DRAM, FRAM and MOS transistor.

The present invention will be illustrated in more detail with reference to examples given below, but these are not to be construed as limiting the present invention.

Example 1

—Preparation of Material for Forming Adhesion Reinforcing Layer—

In a reaction vessel, 1.78 g (0.01 mol) of methyltriethoxysilane as the organoalkoxysilane, 0.061 g (0.001 mol) of monoethanolamine as the basic additive and ethanol were charged, and the solution temperature was stabilized at 56° C. Then, 0.18 g (0.01 mol) of ion-exchanged water was delivered by drops over 30 minutes. After the completion of dropping, an aging reaction was performed over two hours, and a coating solution for forming an adhesion reinforcing layer (a material for forming an adhesion reinforcing layer) was prepared. Here, the existence of an oligomer produced by hydrolysis and condensation of an alkoxy group in methyltriethoxysilane was confirmed in the coating solution for forming an adhesion reinforcing layer by means of Gel Permeation Chromatograph method. Also, the concentration of the oligomer was adjusted by varying appropriately the added quantity of ethanol.

Moreover, the oligomer in the coating solution for forming an adhesion reinforcing layer was adjusted to a concentration of 1% by mass with tetrahydrofuran (THF). The weight average molecular weight was measured by Gel Permeation Chromatograph method by means of an apparatus 'HLC-8020' manufactured by Tosoh Corporation and found to be 1,400.

Example 2

—Preparation of Material for Forming Adhesion Reinforcing Layer—

In a reaction vessel, 2.21 g (0.01 mol) of 3-aminopropyltriethoxysilane as the organoalkoxysilane having a nitrogen-containing basic functional group and ethanol were charged, and the solution temperature was stabilized at 56° C. Then, 0.18 g (0.01 mol) of ion-exchanged water was delivered by drops over 30 minutes. After the completion of dropping, an aging reaction was performed over two hours, and a coating solution for forming an adhesion reinforcing layer (a material for forming an adhesion reinforcing layer) was prepared. Here, the existence of an oligomer produced by hydrolysis and condensation of an alkoxy group in 3-aminopropyltriethoxysilane was confirmed in the coating solution for forming an adhesion reinforcing layer by means of Gel Permeation Chromatograph method. Also, the concentration of the oligomer was adjusted by varying appropriately the added quantity of ethanol Moreover, the oligomer in the coating solution for forming an adhesion reinforcing layer was adjusted to a concentration of 1% by mass with tetrahydrofuran (THF). The weight average molecular weight was measured by Gel Permeation Chromatograph method by means of an apparatus 'HLC-8020' manufactured by Tosoh Corporation and found to be 1,850.

Example 3

—Preparation of Material for Forming Adhesion Reinforcing Layer—

A coating solution for forming an adhesion reinforcing layer (a material for forming an adhesion reinforcing layer) was prepared in the same manner as in Example 1 except that monoethanolamine in Example 1 was not added.

The weight average molecular weight of the oligomer in the coating solution for forming an adhesion reinforcing layer obtained was 650.

Example 4

—Preparation of Material for Forming Adhesion Reinforcing Layer—

A coating solution for forming an adhesion reinforcing layer (a material for forming an adhesion reinforcing layer) was prepared in the same manner as in Example 2 except that ethanol in Example 2 was replaced by propylene glycol monomethyl ether acetate.

The weight average molecular weight of the oligomer in the coating solution for forming an adhesion reinforcing layer obtained was 1,950.

Example 5

—Preparation of Material for Forming Adhesion Reinforcing Layer—

A coating solution for forming an adhesion reinforcing layer (a material for forming an adhesion reinforcing layer) was prepared in the same manner as in Example 2 except that the solution temperature in Example 2 was changed to a room temperature.

The coating solution for forming an adhesion reinforcing layer was observed for the existence of an oligomer by means of Gel Permeation Chromatograph method, and the existence of an oligomer was not confirmed (the hydrolysis and the condensation reaction did not essentially proceed). Also, the weight average molecular weight was 160, and almost no oligomer was included.

Example 6

—Manufacturing of Semiconductor Device—

A semiconductor device was manufactured using a common manufacturing process of a semiconductor device except that the formation process of the low dielectric constant film and the formation process of the adhesion reinforcing layer were performed.

—Preparation of Material for Forming Low Dielectric Constant Film—

In a reaction vessel having a volume of 200 mL, 20.8 g (0.1 mol) of tetraethoxysilane, 17.8 g (0.1 mol) of methyltriethoxysilane, 23.6 g (0.1 mol) of glycidoxypropyltrimethoxysilane and 39.6 g of methylisobutylketone were charged, and 16.2 g (0.9 mol) of 1% by mass of tetramethyl ammonium hydroxide solution was delivered by drops over 10 minutes. After the completion of dropping, an aging reaction was performed over two hours. Then, after 5 g of magnesium sulfate was added to remove excess moisture, ethanol produced by the aging reaction was removed until the volume of the reacted solution was reduced to 50 mL. To the reacted solution obtained, 20 mL of methylisobutylketone was added, and finally a coating solution of porous silica precursor for wiring insulating layer (a material for forming a low dielectric constant film) was prepared.

The obtained coating solution of porous silica precursor was applied on an Si substrate by the spin coating method, which was pre-baked at 250° C. over 3 minutes. Then, the degree of cross-linking was calculated based on the absorption intensity of SiOH near 950 $cm^{-1}$ using a Fourier Transform Infrared Spectrophotometer (FT-IR), and it was found to be 75%.

Next, a baking was performed in an electric furnace under $N_2$-gas atmosphere at a temperature of 400° C. over 30 minutes, and a porous silica film (low dielectric constant film) was obtained.

The dielectric constant of the obtained porous silica film (low dielectric constant film) was calculated based on the volume measured using a mercury prober, and it was found to be 2.24. Also, the modulus of elasticity and the hardness of the porous silica film were measured using an indentation hardness tester (Nano Indenter XP manufactured by Nano Instruments); the modulus of elasticity was 9 GPa, and the hardness was 1 GPa.

<Process for Forming Adhesion Reinforcing Layer>

An SiC film having a thickness of 50 nm was formed on an Si substrate as the processed substrate by chemical vapor deposition.

Then, it was baked in an electric furnace under $N_2$-gas atmosphere with conditions of 400° C. and 30 minutes (the baking process) to form a low dielectric constant film.

On top of that, an SiC film was formed by chemical vapor deposition such that the film had a thickness of 50 nm.

Next, after the Si substrate on which the adhesion reinforcing layer and the low dielectric constant film had been laminated was left to stand in steam at 100° C. over one hour, the Si substrate was cut into 25, and 25 samples of the Si substrate on which the adhesion reinforcing layer and the low dielectric constant film had been laminated were obtained.

A stud pin having a diameter of 2 mm was glued on the top-most surface of the SiC film of each obtained sample using an epoxy resin, and a tensile test was performed using SEBASTIAN tester. Thus, the adhesion of the low dielectric constant film was evaluated. The aspect in which the adhesion reinforcing layer was not arranged was also evaluated. The results are shown in Table 1. Table 1 also shows the oligomer concentration, the baking temperature and the presence or absence of surface washing with respect to the coating solution for forming the adhesion reinforcing layer as well as the film thickness of the adhesion reinforcing layer.

Furthermore, the coating solutions for forming an adhesion reinforcing layer obtained in Examples 1 to 5 were preserved at a room temperature. Although the coating solutions for forming an adhesion reinforcing layer of Example 4 and Example 5 gelated after one month of standing, showing low preservation stability compared to other Examples, the coating solutions for forming an adhesion reinforcing layer of Examples 1 to 3 were found to have favorable preservation stability.

TABLE 1

| | Coating solution for forming an adhesion reinforcing layer | | | Adhesion Reinforcing Layer | |
|---|---|---|---|---|---|
| No. | Oligomer Concentration (% by mass) | Baking Temperature (° C.) | Surface Washing | Film Thickness (nm) | Removed Stud Pin |
| Example 1 | 0.08 | 180 | Present | 1.7 | 0 |
| | 0.08 | 180 | Absent | 2.6 | 4 |
| | 0.08 | 150 | Absent | 3.2 | 9 |
| | 0.08 | 250 | Absent | 1.4 | 12 |
| | 0.14 | 180 | Absent | 5.5 | 16 |
| Example 2 | 0.09 | 180 | Present | 1.1 | 0 |
| | | | Absent | 1.8 | 4 |
| Example 3 | 0.06 | 180 | Absent | 1.2 | 12 |
| Example 4 | 0.08 | 180 | Absent | 2.1 | 3 |
| Example 5 | — | 180 | Absent | 0.9 | 11 |
| | | No adhesion reinforcing layer | | | 25 |

Then, the coating solutions for forming an adhesion reinforcing layer obtained in Examples 1 to 5 were applied on the SiC film by the spin coating method. Each of the above was baked over one minute at a respective temperature indicated in Table 1 to form an adhesion reinforcing layer. Here, after baking, surface washing was performed with ethanol for the adhesion reinforcing layers formed with materials for forming an adhesion reinforcing layer in Example 1 and Example 2.

<Process for Forming Low Dielectric Constant Film>

The coating solution of porous silica precursor (material for forming a dielectric constant film) obtained by the preparation of the material for forming a low dielectric constant film was applied on the adhesion reinforcing layer by the spin coating method (the coating process) followed by baking at a temperature of 250° C. over 3 minutes (the heating process).

Table 1 indicates: without the adhesion reinforcing layer of the present invention, all the 25 samples had an interfacial debonding between the low dielectric constant film and the SiC film and degraded adhesion, whereas, for the samples having the adhesion reinforcing layer of the present invention formed using the material for forming an adhesion reinforcing layer of the present invention, the adhesion was reinforced to prevent interfacial debonding between the low dielectric constant film and the SiC film, with which the adhesion reinforcing layer was in contact.

Example 7

—Manufacturing of Semiconductor Device—

Figure 1:
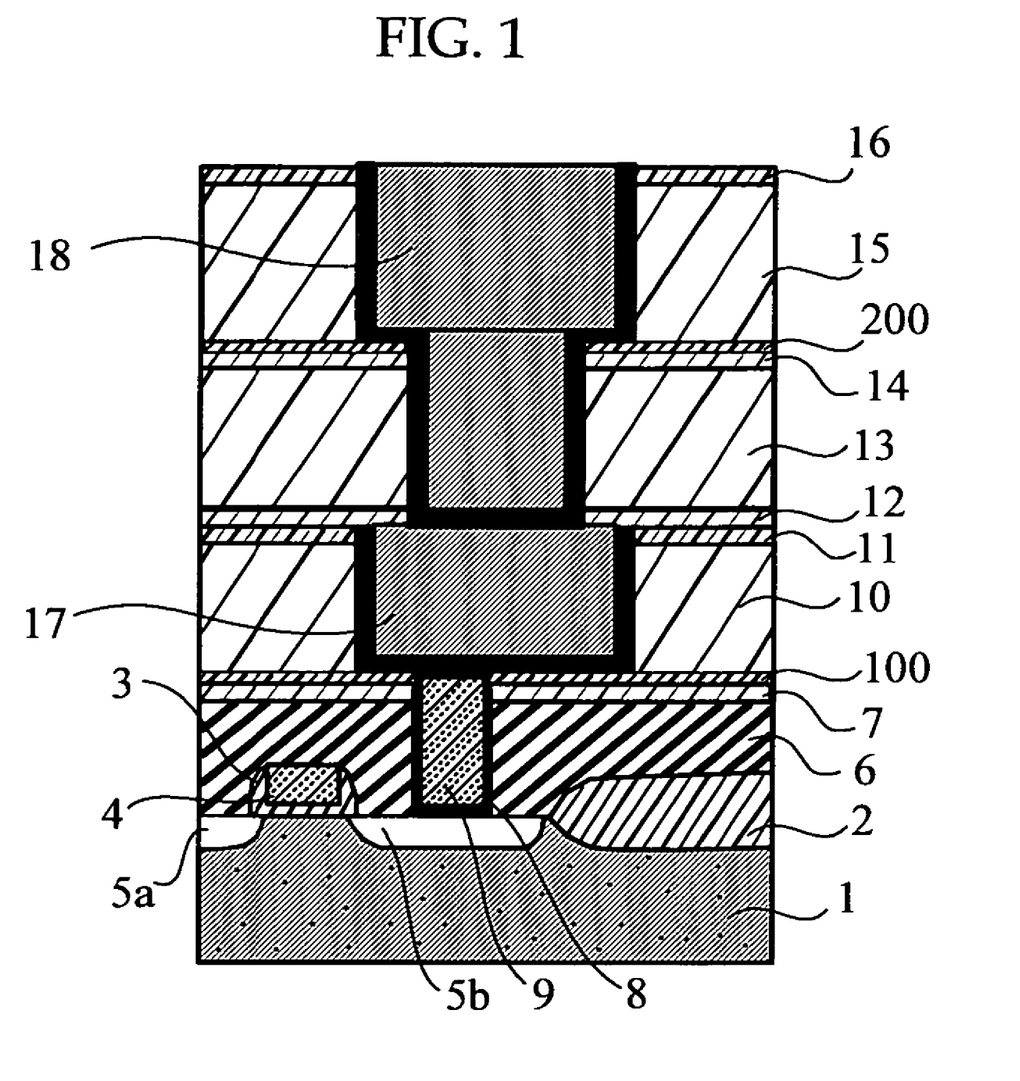
FIG. 1 is a schematic explanatory diagram showing an exemplary semiconductor device of the present invention having an adhesion reinforcing layer of the present invention.

A semiconductor device of the present invention was manufactured as follows. First, as indicated in FIG. 1, on a silicon wafer 1 having a transistor which is separated by an isolation film 2 and has a source diffusion layer 5a, a drain diffusion layer 5b and a gate electrode 4 having a walled insulating layer 3, an inter-layer insulating film 6 (phosphorous glass) and a stopper film 7 (SiC) were formed, followed by formation of a contact hole for removing the electrode. A barrier film 8 (TiN) was formed at this contact hole by the sputtering method such that the thickness was 50 nm. Then, by mixing $WF_6$ with hydrogen and reducing, a conductor plug 9 (blanket) by W was embedded in the contact hole to form a via, and the portion other than the via was removed by chemical mechanical polishing (CMP).

Subsequently, after an adhesion reinforcing layer 100 was formed on the stopper film 7 on which the via was formed using the coating solution for forming an adhesion reinforcing layer of the present invention such that the thickness was 2.0 nm, a low dielectric constant film (wiring insulating film) 10 was formed such that the thickness was 250 nm, and further TEOS—$SiO_2$ as a cap film (protective layer) 11 was laminated on the surface of the low dielectric constant film 10 such that the thickness was 50 nm. Here, with a patterned resist layer used as a mask for the low dielectric constant film, a wiring gutter was formed on the low dielectric constant film 10 by F-plasma process with $CF_4/CHF_3$ as a source gas. Then, the barrier film 8 (TiN) was formed on the formed wiring gutter by the sputtering method to prevent the wiring material (copper) from diffusing into the low dielectric constant film such that the thickness of the barrier film was 50 nm. Further, a seed layer (Cu) which functioned as an electrode in electrolytic plating was formed on the surface of the barrier film 8 formed on the wiring gutter such that the thickness of the seed layer was 50 nm. Next, after a copper wiring 18 (Cu) was laminated with a thickness of about 600 nm by electrolytic plating, the copper other than the wiring-patterned portion was removed by chemical mechanical polishing (CMP) to form a wiring layer (copper) as a first layer.

Next, a via and a wiring layer were formed simultaneously by the dual damascene method.

First, an SiC film as a stopper film (diffusion protecting film) 12 was formed on the wiring layer (copper) as the first layer such that the thickness of the SiC film was 50 nm. The stopper film (diffusion protecting film) 12 was formed by the plasma-CVD method with a silane and an ammonia gas for the purpose of preventing the wiring material (copper) from diffusing into a low dielectric constant film. Next, a low dielectric constant film (wiring insulating film: SiOC film) 13 was laminated with the coating solution for forming a low dielectric constant film such that the thickness of the film was 250 nm. On the low dielectric constant film 13, an SiC film as a stopper film 14 was formed by the plasma-CVD method with a silane and an ammonia gas such that the thickness of the SiC film was 50 nm. Further, after an adhesion reinforcing layer 200 was formed on top of that using the coating solution for forming an adhesion reinforcing layer of the present invention such that the thickness was 2.0 nm, a low dielectric constant film 15 was formed using the composition for a low dielectric constant film such that the thickness was 400 nm, and TEOS—$SiO_2$ as a capping film (protective film) 16 was laminated such that the thickness was 50 nm.

Here, on the low dielectric constant film 15, using a via-patterned resist layer as a mask and varying the gas composition for the F-plasma process with $CF_4/CHF_3$ as a source gas, the capping film 16, the low dielectric constant film 15, the stopper film 14, the low dielectric constant film 13 and the stopper film 12 were processed in this order to form a via. Then, using a wiring-patterned resist layer as a mask, the low dielectric constant film 15 was processed by the F-plasma process with $CF_4/CHF_3$ as a source gas to form a wiring gutter. On the formed via and wiring gutter, a barrier film 8 (TiN) which protect the wiring material (copper) from diffusing into the low dielectric constant film 15 was formed by the sputtering method such that the film thickness was 50 nm. Sequentially, on the surface of the barrier film 8 formed on the wiring gutter, a seed layer (Cu) which functioned as an electrode in electrolytic plating was formed such that the thickness was 50 nm. Next, after a copper wiring 17 (Cu) was laminated by electrolytic plating with a thickness of about 1,400 nm, the copper other than the wiring-patterned portion was removed by chemical mechanical polishing (CMP) to form a wiring layer (copper) as a second layer.

In what follows, the formation of the via and wiring layer (copper) of the second layer was repeated for a third layer with a via and wiring layer (copper) to manufacture a semiconductor device having a three-layer structure. One million semiconductor devices having continuous via chains with continued vias and copper wirings were manufactured, and the yield of the continuous via chains was 95% or greater. No fracture due to the bonding pressure was observed in wire bonding.

In addition, the cross section of the multi-layer wiring obtained was analyzed with a transmission electron microscope (TEM), and layers including Si, C and N were observed on the stopper layer 7 and the diffusion protecting layer 13. Therefore, the existence of the adhesion reinforcing layers of the present invention was confirmed. The nitrogen content of the adhesion reinforcing layers were measured by TEM-EDX and found to be 9% by mass.

Comparative Example 1

A semiconductor device having a multi-layer wiring was manufactured in the same manner as Example 7 except that the adhesion reinforcing layer of the present invention was not formed when the low dielectric constant film 10 was formed in Example 7. One million semiconductor devices were manufactured, and the yield of the continuous via chains was 95% or greater. In wire bonding, a fracture due to the bonding pressure occurred at the boundary of the low dielectric constant film.

The present invention can resolve the existing problem, and it can provide: a material for forming an adhesion reinforcing layer which can reinforce the adhesion between a low dielectric constant film and other members, in particular between a low dielectric constant film containing an inorganic material and other members; an adhesion reinforcing layer which is formed by the material for forming an adhesion reinforcing layer and exhibits superior adhesion; a semiconductor device having the adhesion reinforcing layer, which is fast and highly reliable; and an efficient manufacturing method thereof.

The material for forming an adhesion reinforcing layer of the present invention provides superior adhesion between inorganic materials; it can reinforce the adhesion between a low dielectric constant film containing inorganic materials and other members; it can be favorably used for forming an adhesion reinforcing layer which provides adhesion to the low dielectric constant film; it can be favorably used especially for the adhesion reinforcing layer of the present invention as well as the manufacturing of the semiconductor device of the present invention.

The manufacturing method of a semiconductor device of the present invention may be favorably used for manufacturing various semiconductor devices including a flash memory, a DRAM, an FRAM and a MOS transistor, and especially for the production of the semiconductor device of the present invention.

Since the semiconductor device of the present invention has the adhesion reinforcing layer of the present invention, debonding of the low dielectric constant film is prevented, and the device is high-speed and highly reliable.

What is claimed is:

1. A material for forming an adhesion reinforcing layer comprising any one of organoalkoxysilane-based compositions having a basic functional group and organoalkoxysilane with a basic additive,
   wherein the organoalkoxysilane is an oligomer which is produced by hydrolysis and condensation of an alkoxy group, and the concentration of the oligomer with respect to the material for forming an adhesion reinforcing layer is 0.1% by mass or less, and
   the basic additive is at least one selected from the group consisting of: sodium hydroxide, potassium hydroxide, lithium hydroxide, pyridine, pyrrole, piperazine, pyrrolidine, piperidine, picoline, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydroxide, tetrabutylammonium hydroxide, ammonia, methylamine, ethylamine, propylamine, butylamine, pentylamine, hexylamine, pentylamine, octylamine, nonylamine, decylamine, N,N-dimethylamine, N,N-diethylamine, N,N-dipropylamine, N,N-dibutylamine, trimethylamine, triethylamine, tripropylamine, tributylamine, cyclohexylamine, trimethylimidine, 1-amino-3-methylbutane, dimethylglycine and 3-amino-3-methylamine.

2. The material for forming an adhesion reinforcing layer according to claim 1, wherein the basic functional group comprises nitrogen.

3. The material for forming an adhesion reinforcing layer according to claim 1, wherein the weight average molecular weight of the oligomer is 100 to 100,000.

4. The material for forming an adhesion reinforcing layer according to claim 1, wherein the material comprises a solvent of an identical component with a product which is obtained by hydrolysis of an alkoxy group.

5. The material for forming an adhesion reinforcing layer according to claim 1, wherein the added amount of the basic additive is 0.5% by mass to 20% by mass with respect to the material for forming an adhesion reinforcing layer.

6. A method for manufacturing a semiconductor device comprising:
   forming a low dielectric constant film on a substrate, and
   forming an adhesion reinforcing layer using a material for forming an adhesion reinforcing layer comprising any one of organoalkoxysilane-based compositions having a basic functional group and organoalkoxysilane with a basic additive,
   wherein the organoalkoxysilane is an oligomer which is produced by hydrolysis and condensation of an alkoxy group, and the concentration of the oligomer with respect to the material for forming an adhesion reinforcing layer is 0.1% mass or less,
   wherein the forming an adhesion reinforcing layer is performed at least any of before and after the forming a low dielectric constant film, and
   the basic additive is at least one selected from the group consisting of sodium hydroxide, potassium hydroxide, lithium hydroxide, pyridine, pyrrole, piperazine, pyrrolidine, piperidine, picoline, monoethanolamine, diethanolamine, demethylmonoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydroxide, tetrabutylammonium hydroxide, ammonia, methylamine, ethylamine, propylamine, butylamine, pentylamine, hexylamine, pentylamine, octylamine, nonylamine, decylamine, N,N-dimethylamine, N,N-diethylamine, N,N-dipropylamine, N,N-dibutylamine, trimethylamine, triethylamine, tripropylamine, tributylamine, cyclohexylamine, trimethylimidine, 1-amino-3-methylbutane, dimethylglycine and 3-amino-3-methylamine.

7. The method for manufacturing a semiconductor device according to claim 6, wherein the forming an adhesion reinforcing layer comprises coating a material for forming an adhesion reinforcing layer on a substrate followed by heating.

8. The method for manufacturing a semiconductor device according to claim 7, wherein the heating is performed at a temperature of 150° C. to 250° C.

9. The method for manufacturing a semiconductor device according to claim 6, wherein the forming an adhesion reinforcing layer comprises washing the substrate using any one of water and an organic solvent.

10. The method for manufacturing a semiconductor device according to claim 6, wherein the forming a low dielectric constant film comprises:
    coating in which a liquid composition comprising an organosilicon compound obtained by hydrolysis tetraalkylorthosilicate and alkoxysilane represented by General Formula (1) below under the presence of tetraalkyl ammonium hydroxide is coated on a processed substrate:

$$X_n Si(OR)_{4-n} \quad \text{General Formula (1)}$$

wherein, in General Formula (I), X represents any one of a hydrogen atom, a fluorine atom, an alkyl group with a carbon number of one to eight, a fluorine-substituted alkyl group, an aryl group and a vinyl group, R represents any one of a hydrogen atom, an alkyl group with a carbon number of one to eight, an aryl group and a vinyl group, and n is an integer of zero to three;
    heating in which a film comprised of the liquid composition coated on the processed substrate is processed under heat at a temperature of 80° C. to 350° C.; and
    baking in which the film heated in the heating process is baked at a temperature in a range between higher than 350° C. and 450° C. or below;
    wherein the method for manufacturing a semiconductor device forms a low dielectric constant film having a dielectric constant of 2.5 or less.

11. The method for manufacturing a semiconductor device according to claim 10, wherein the baking process takes place under inert-gas atmosphere with an oxygen concentration of 100 ppm or less.

12. The method for manufacturing a semiconductor device according to claim 6, wherein the low dielectric constant film is arranged to contact with at least any one of an $SiO_2$ film, an SiN film, an SiC film, an SiOC film and an SiCN film through the adhesion reinforcing layer.

13. The method for manufacturing a semiconductor device according to claim 6, wherein the modulus of elasticity of the low dielectric film is 5 GPa or greater, and the hardness of the low dielectric film is 0.6 GPa or greater.

* * * * *